United States Patent
Lee et al.

(10) Patent No.: US 10,204,686 B2
(45) Date of Patent: Feb. 12, 2019

(54) PAGE BUFFER, METHOD OF SENSING A MEMORY CELL USING THE SAME, AND NONVOLATILE MEMORY DEVICE INCLUDING THE SAME

(71) Applicant: SAMSUNG ELECTRONICS CO., LTD., Suwon-si, Gyeonggi-do (KR)

(72) Inventors: Tae-Yun Lee, Hwaseong-si (KR); Chae-Hoon Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/871,322

(22) Filed: Jan. 15, 2018

(65) Prior Publication Data

US 2019/0019561 A1   Jan. 17, 2019

(30) Foreign Application Priority Data

Jul. 11, 2017   (KR) ........................ 10-2017-0088062

(51) Int. Cl.
*G11C 16/26* (2006.01)
*G11C 16/24* (2006.01)
*G11C 16/30* (2006.01)

(52) U.S. Cl.
CPC .............. *G11C 16/26* (2013.01); *G11C 16/24* (2013.01); *G11C 16/30* (2013.01)

(58) Field of Classification Search
CPC .......... G11C 16/26; G11C 16/24; G11C 16/30
See application file for complete search history.

(56) References Cited

U.S. PATENT DOCUMENTS

| | | | |
|---|---|---|---|
| 6,704,239 B2 | 3/2004 | Cho et al. | |
| 7,190,613 B2 | 3/2007 | Byeon | |
| 8,045,391 B2 | 10/2011 | Mokhlesi | |
| 8,300,473 B2 | 10/2012 | Cernea | |
| 8,437,191 B2 * | 5/2013 | Lee ........................ | G11C 16/26 365/185.12 |
| 9,697,604 B2 * | 7/2017 | Wang .................... | H04N 13/246 |
| 2017/0011799 A1 * | 1/2017 | Lee ......................... | G11C 16/10 |
| 2017/0243653 A1 * | 8/2017 | Missiroli ................ | G11C 16/24 |
| 2017/0323685 A1 * | 11/2017 | Lee ..................... | G11C 16/3459 |
| 2017/0358335 A1 * | 12/2017 | Yang ........................ | G11C 7/12 |

* cited by examiner

*Primary Examiner* — Tri Hoang
(74) *Attorney, Agent, or Firm* — F. Chau & Associates, LLC

(57) ABSTRACT

A page buffer includes a first precharge circuit, a second precharge circuit, and a sense amplifying circuit. The first precharge circuit includes a first path for precharging a bitline connected to a nonvolatile memory cell. The second precharge circuit includes a second path for precharging a sensing node connected to the bitline. The second path is electrically separated from the first path. The sensing node is used to detect a state of the nonvolatile memory cell. The sense amplifying circuit is connected to the sensing node and the second precharge circuit, and stores state information representing the state of the nonvolatile memory cell. The second precharge circuit is configured to perform a first precharge operation for the sensing node and configured to selectively perform a second precharge operation for the sensing node based on the state of the nonvolatile memory cell after the first precharge operation.

20 Claims, 13 Drawing Sheets

PAGE BUFFER, METHOD OF SENSING A MEMORY CELL USING THE SAME, AND NONVOLATILE MEMORY DEVICE INCLUDING THE SAME

CROSS-REFERENCE TO RELATED APPLICATION

This application claims priority under 35 U.S.C. § 119 to Korean Patent Application No. 10-2017-0088062, filed on Jul. 11, 2017 in the Korean Intellectual Property Office (KIPO), the disclosure of which is incorporated by reference herein in its entirety.

TECHNICAL FIELD

Exemplary embodiments of the inventive concept relate generally to semiconductor integrated circuits, and more particularly, to page buffers, methods of sensing memory cells using the page buffers, and nonvolatile memory devices including the page buffers.

DISCUSSION OF RELATED ART

Semiconductor memory devices can be roughly divided into two categories depending upon whether they retain stored data when disconnected from a power supply. These two categories are: volatile memory devices, which lose stored data when disconnected from power, and nonvolatile memory devices, which retain stored data when disconnected from power. A nonvolatile memory device includes a page buffer that includes a sensing node for determining a state of a memory cell therein (e.g., data stored in the memory cell). For example, the state of the memory cell may be determined by detecting a current flowing through the sensing node. As the integration of nonvolatile memory devices increases, interferences between neighboring sensing nodes as well as sensing errors may become greater.

SUMMARY

According to an exemplary embodiment of the inventive concept, a page buffer includes a first precharge circuit, a second precharge circuit, and a sense amplifying circuit. The first precharge circuit includes a first path for precharging a bitline connected to a nonvolatile memory cell. The second precharge circuit includes a second path for precharging a sensing node connected to the bitline. The second path is electrically separated from the first path. The sensing node is used to detect a state of the nonvolatile memory cell. The sense amplifying circuit is connected to the sensing node and the second precharge circuit, and stores state information representing the state of the nonvolatile memory cell. The second precharge circuit is configured to perform a first precharge operation for the sensing node and configured to selectively perform a second precharge operation for the sensing node based on the state of the nonvolatile memory cell after the first precharge operation.

According to an exemplary embodiment of the inventive concept, a nonvolatile memory device includes a memory cell array and a page buffer circuit. The memory cell array includes a plurality of nonvolatile memory cells connected to a plurality of bitlines and a plurality of wordlines. The page buffer circuit includes a plurality of page buffers connected to the plurality of bitlines. A first page buffer among the plurality of page buffers includes a first precharge circuit, a second precharge circuit, and a sense amplifying circuit. The first precharge circuit includes a first path for precharging a first bitline among the plurality of bitlines connected to a first nonvolatile memory cell among the plurality of nonvolatile memory cells. The second precharge circuit includes a second path for precharging a sensing node connected to the first bitline. The second path is electrically separated from the first path. The sensing node is used to detect a state of the first nonvolatile memory cell. The sense amplifying circuit is connected to the sensing node and the second precharge circuit, and stores state information representing the state of the first nonvolatile memory cell. The second precharge circuit is configured to perform a first precharge operation for the sensing node and configured to selectively perform a second precharge operation for the sensing node based on the state of the first nonvolatile memory cell after the first precharge operation.

According to an exemplary embodiment of the inventive concept, in a method of sensing a nonvolatile memory cell using a page buffer, the page buffer is connected to the nonvolatile memory cell through a bitline and includes a first path, a second path, and a sensing node. The first path and the second path are electrically separated from each other. The sensing node is connected to the bitline and used to detect a state of the nonvolatile memory cell. A bitline precharge operation for the bitline is performed by the first path. A first precharge operation for the sensing node is performed by the second path. A first developing operation for varying a voltage at the sensing node is performed. A first storing operation for storing a result of the first developing operation is performed. A second precharge operation for the sensing node is selectively performed based on the state of the nonvolatile memory cell by the second path. A second developing operation for varying the voltage at the sensing node is selectively performed based on the state of the nonvolatile memory cell. The voltage at the sensing node is detected.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
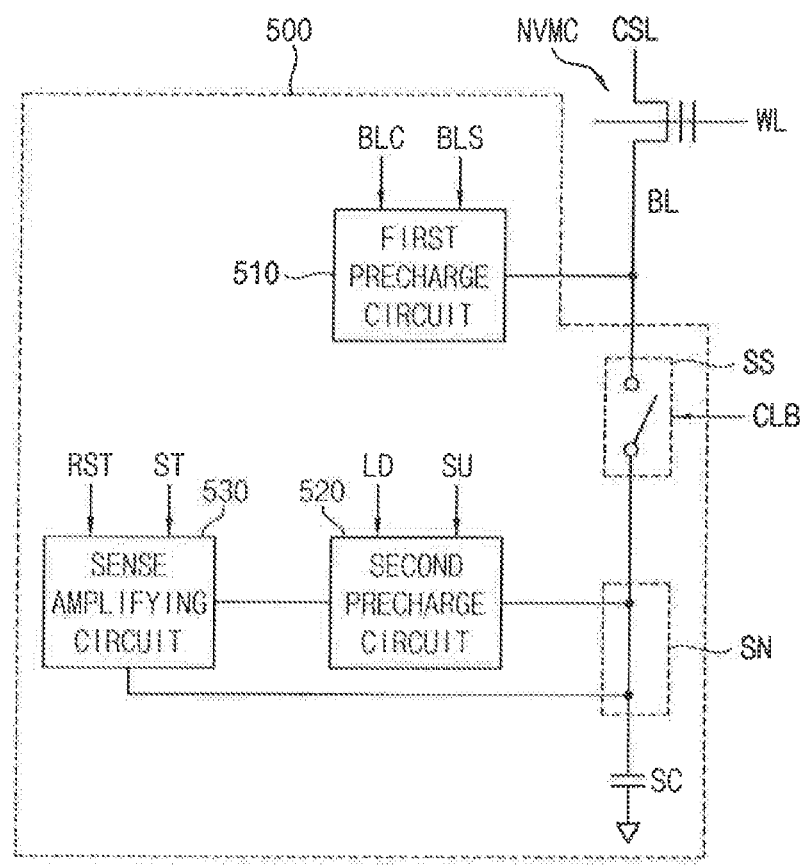
FIG. 1 is a block diagram illustrating a page buffer according to an exemplary embodiment of the inventive concept.

Exemplary embodiments of the inventive concept provide a page buffer capable of efficiently determining a state of a memory cell.

Exemplary embodiments of the inventive concept provide a nonvolatile memory device including the page buffer.

Exemplary embodiments of the inventive concept provide a method of sensing the memory cell using the page buffer.

Exemplary embodiments of the inventive concept will be described more fully hereinafter with reference to the accompanying drawings. Like reference numerals may refer to like elements throughout this application.

FIG. 1 is a block diagram illustrating a page buffer according to an exemplary embodiment of the inventive concept.

Referring to FIG. 1, a page buffer 500 includes a first precharge circuit 510, a second precharge circuit 520, and a sense amplifying circuit 530. The page buffer 500 may further include a sensing node SN, a sensing capacitor SC, and a switch SS.

The page buffer 500 is connected to a nonvolatile memory cell NVMC. For example, the page buffer 500 may be electrically connected to the nonvolatile memory cell NVMC through a bitline BL. The nonvolatile memory cell NVMC may also be connected to a wordline WL and a common source line CSL.

The page buffer 500 may detect or determine a state of the nonvolatile memory cell NVMC (e.g., data stored in the nonvolatile memory cell NVMC) by sensing a current that flows through the nonvolatile memory cell NVMC and is changed depending on the state of the nonvolatile memory cell NVMC. For example, the current may be sensed by the sensing node SN. The page buffer 500 may operate as a write driver or a sensing amplifier depending on an operation mode of a nonvolatile memory device including the nonvolatile memory cell NVMC.

The first precharge circuit 510 is connected to the bitline BL to precharge the bitline BL. The first precharge circuit 510 includes a first path for precharging the bitline BL. The first precharge circuit 510 may operate in response to a bitline precharge control signal BLC and a bitline selection signal BLS.

The second precharge circuit 520 is connected to the sensing node SN to precharge the sensing node SN. The sensing node SN is connected to the bitline BL and is used to detect the state of the nonvolatile memory cell NVMC. The second precharge circuit 520 includes a second path for precharging the sensing node SN. The second precharge circuit 520 may operate in response to a first precharge control signal LD and a second precharge control signal SU.

The sense amplifying circuit 530 is connected to the sensing node SN and the second precharge circuit 520. The sense amplifying circuit 530 stores state information representing the state of the nonvolatile memory cell NVMC. The sense amplifying circuit 530 may operate in response to a reset signal RST and a setting signal ST.

The sensing capacitor SC may be connected between the sensing node SN and a ground voltage. The switch SS may selectively connect the bitline BL and the sensing node SN in response to a first control signal CLB.

In the page buffer 500 according to an exemplary embodiment of the inventive concept, the second path for precharging the sensing node SN is electrically separated from the first path for precharging the bitline BL. Thus, the page buffer 500 may separately, individually, and independently perform a precharge operation for the bitline BL and a precharge operation for the sensing node SN.

For example, every time the page buffer 500 detects or determines the state of the nonvolatile memory cell NVMC, the first precharge circuit 510 may perform a bitline precharge operation for the bitline BL once, and the second precharge circuit 520 may perform a first precharge operation for the sensing node SN and may selectively perform a second precharge operation for the sensing node SN based on the state of the nonvolatile memory cell NVMC after the first precharge operation. In other words, the precharge operation for the bitline BL may be performed once regardless of the state of the nonvolatile memory cell NVMC, and thus may be referred to as an unconditional precharge operation. The precharge operation for the sensing node SN may be performed once or twice depending on the state of the nonvolatile memory cell NVMC, and thus may be referred to as a conditional or selective precharge operation.

Hereinafter, configurations and operations of the page buffer according to exemplary embodiments of the inventive concept will be described in detail with reference to FIGS. 2 through 8.

Figure 2:
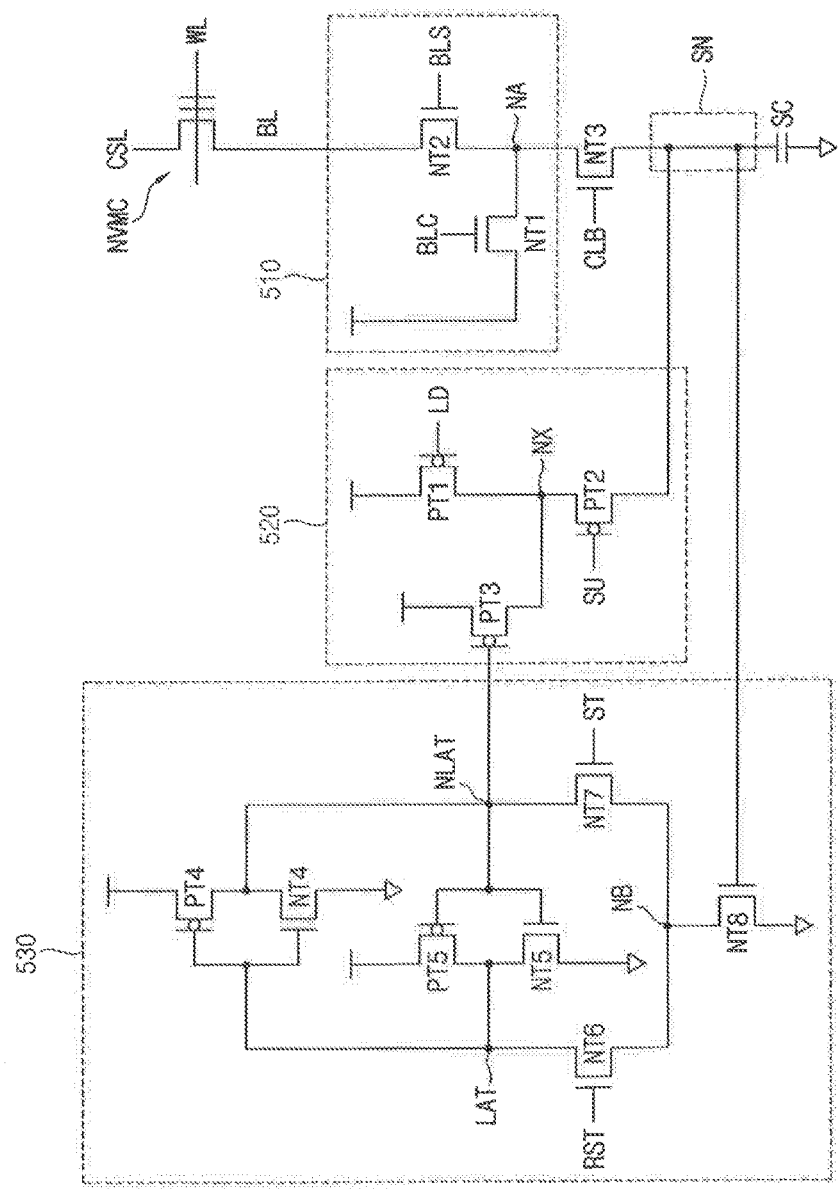
FIG. 2 is a circuit diagram illustrating a page buffer of FIG. 1 according to an exemplary embodiment of the inventive concept.

FIG. 2 is a circuit diagram illustrating a page buffer of FIG. 1 according to an exemplary embodiment of the inventive concept.

In a circuit diagram such as FIG. 2, a horizontal line (e.g., -) connected to one electrode of a transistor represents a power supply voltage (e.g., VDD), and an inverted triangle (e.g., ∇) connected to one electrode of a transistor or one end of a capacitor represents a ground voltage (e.g., GND or VSS).

Referring to FIG. 2, a page buffer includes a first precharge circuit 510, a second precharge circuit 520, and a sense amplifying circuit 530. The page buffer may further include the sensing node SN, the sensing capacitor SC, and a transistor NT3.

The second precharge circuit 520 is connected to the sensing node SN to precharge the sensing node SN. The second precharge circuit 520 may include a plurality of transistors PT1, PT2, and PT3.

The transistor PT1 may be connected between the power supply voltage and a first node NX, and may include a gate electrode receiving the first precharge control signal LD. The transistor PT2 may be connected between the first node NX and the sensing node SN, and may include a gate electrode receiving the second precharge control signal SU. The transistor PT3 may be connected in parallel with the transistor PT1 between the power supply voltage and the first node NX, and may include a gate electrode connected to the sense amplifying circuit 530. For example, the gate electrode of the transistor PT3 may be connected to a second latch node NLAT of the sense amplifying circuit 530.

The first precharge circuit 510 is connected to the bitline BL to precharge the bitline BL. The first precharge circuit 510 may include a plurality of transistors NT1 and NT2.

The transistor NT1 may be connected between the power supply voltage and a second node NA, and may include a gate electrode receiving the bitline precharge control signal BLC. The transistor NT2 may be connected between the bitline BL and the second node NA, and may include a gate electrode receiving the bitline selection signal BLS. For example, the transistor NT1 may be separated from the first node NX, and thus the first path in the first precharge circuit 510 and the second path in the second precharge circuit 520 may be electrically separated from each other.

The transistor NT3 may be connected between the second node NA and the sensing node SN, and may include a gate electrode receiving the first control signal CLB. The transistor NT3 in FIG. 2 may correspond to the switch SS in FIG. 1.

The sense amplifying circuit 530 is connected to the sensing node SN and the second precharge circuit 520. The sense amplifying circuit 530 may include a plurality of transistors PT4, NT4, PT5, NT5, NT6, NT7, and NT8.

The transistor PT4 may be connected between the power supply voltage and the second latch node NLAT, and may include a gate electrode connected to a first latch node LAT. The transistor NT4 may be connected between the second latch node NLAT and the ground voltage, and may include a gate electrode connected to the first latch node LAT. The transistor PT5 may be connected between the power supply voltage and the first latch node LAT, and may include a gate electrode connected to the second latch node NLAT. The transistor NT5 may be connected between the first latch node LAT and the ground voltage, and may include a gate electrode connected to the second latch node NLAT.

The transistors PT4 and NT4 may form a first inverter, and the transistors PT5 and NT5 may form a second inverter. The first inverter and the second inverter may be implemented with a latch structure, where inputs and outputs of the first and second inverters are cross-coupled. For example, the first inverter may include an input terminal connected to the first latch node LAT and an output terminal connected to the second latch node NLAT. The second inverter may include an input terminal connected to the second latch node NLAT and an output terminal connected to the first latch node LAT.

The transistor NT6 may be connected between the first latch node LAT and a third node NB, and may include a gate electrode receiving the reset signal RST. The transistor NT7 may be connected between the second latch node NLAT and the third node NB, and may include a gate electrode receiving the setting signal ST. The transistor NT8 may be connected between the third node NB and the ground voltage, and may include a gate electrode connected to the sensing node SN.

In an exemplary embodiment of the inventive concept, each of the transistors PT1, PT2, PT3, PT4, PT5, and PT6 may be a p-type metal oxide semiconductor (PMOS) transistor, and each of the transistors NT1, NT2, NT3, NT4, NT5, NT6, NT7, and NT8 may be an n-type metal oxide semiconductor (NMOS) transistor. In an exemplary embodiment of the inventive concept, types of the transistors PT1, PT2, PT3, PT4, PT5, PT6, NT1, NT2, NT3, NT4, NT5, NT6, NT7, and NT8 may be changed.

In an exemplary embodiment of the inventive concept, the nonvolatile memory cell NVMC connected to the page buffer may be a NAND flash memory cell. In an exemplary embodiment of the inventive concept, the nonvolatile memory cell NVMC may be any memory cell, such as a phase random access memory (PRAM) cell, a ferroelectric random access memory (FRAM) cell, a resistive random access memory (RRAM) cell, a magnetic random access memory (MRAM) cell, etc.

Figure 3:
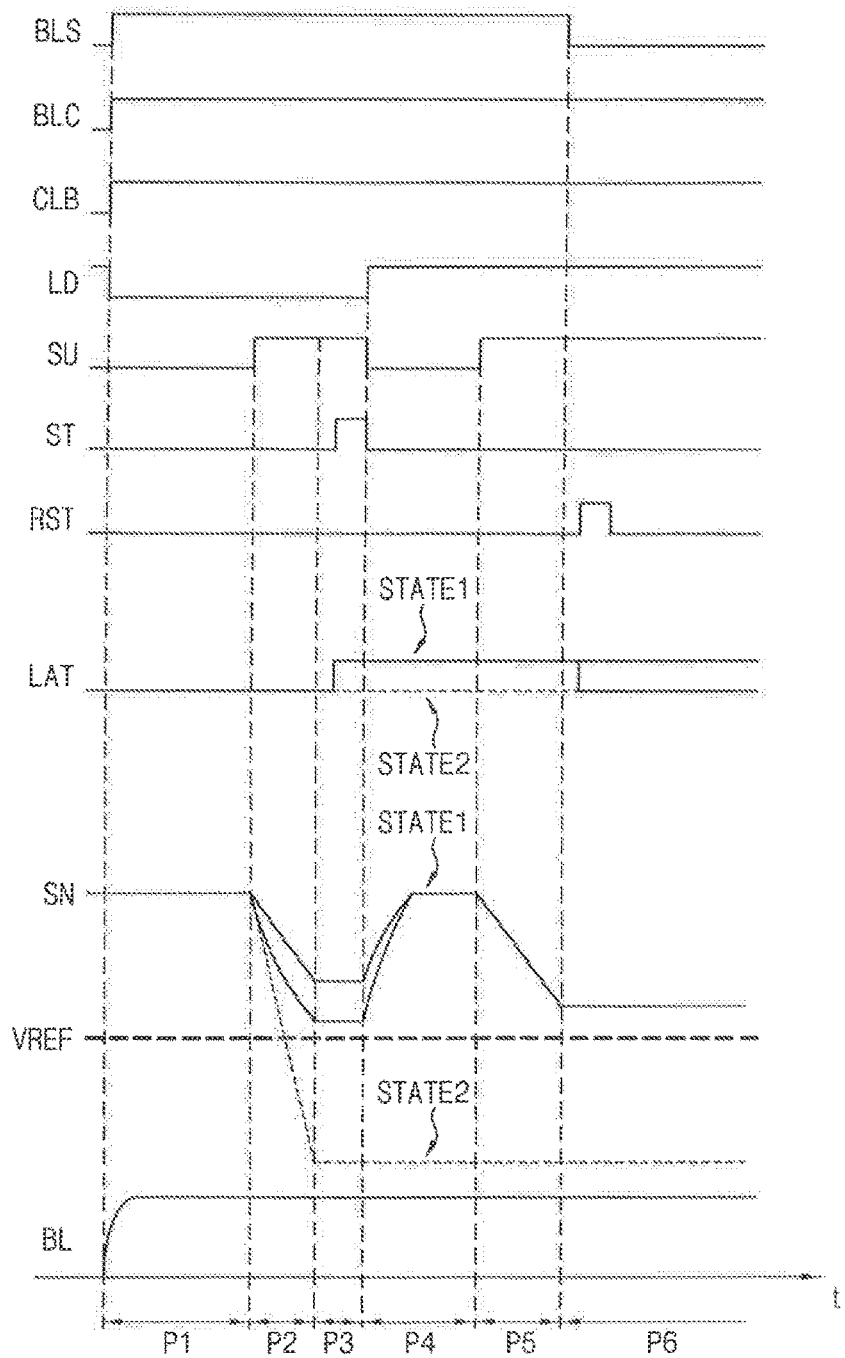
FIG. 3 is a timing diagram for describing an operation of the page buffer of FIG. 2 according to an exemplary embodiment of the inventive concept.

FIG. 3 is a timing diagram for describing an operation of the page buffer of FIG. 2 according to an exemplary embodiment of the inventive concept.

Referring to FIGS. 2 and 3, an operation of the page buffer of FIG. 2 is described in detail based on an example where the nonvolatile memory cell NVMC is a NAND flash memory cell.

If the nonvolatile memory cell NVMC is a NAND flash memory cell, the nonvolatile memory cell NVMC may include a charge storage layer (or a charge trapping layer). The nonvolatile memory cell NVMC may have a first state STATE1 or a second state STATE2 depending on the number of charges stored in the charge storage layer. For example, when the number of charges stored in the charge storage layer is greater than a reference number (e.g., when a sufficient number of charges are stored in the charge storage layer), the nonvolatile memory cell NVMC may have the first state STATE1, and a current less than a reference current may flow through the nonvolatile memory cell NVMC. When the number of charges stored in the charge storage layer is less than or equal to the reference number (e.g., when no charges are stored in the charge storage layer), the nonvolatile memory cell NVMC may have the second state STATE2, and a current greater than or equal to the reference current may flow through the nonvolatile memory cell NVMC. The nonvolatile memory cell NVMC having the first state STATE1 may be referred to as an upper state cell or an off cell, and the nonvolatile memory cell NVMC having the second state STATE2 may be referred to as a lower state cell or an on cell.

In an operation of detecting or determining the state of the nonvolatile memory cell NVMC, during a period P1, the bitline precharge operation for the bitline BL is performed, and the first precharge operation for the sensing node SN and the sensing capacitor SC is substantially simultaneously or concurrently performed.

For example, during the period P1, since the bitline precharge control signal BLC and the bitline selection signal BLS have logic high levels, the transistors NT1 and NT2 are turned on, and thus the bitline BL is precharged. A current path including the power supply voltage and the transistors NT1 and NT2 may correspond to the first path in the first precharge circuit 510.

Since the first precharge control signal LD and the second precharge control signal SU have logic low levels, the transistors PT1 and PT2 are turned on, and thus the sensing node SN and the sensing capacitor SC are precharged. A current path including the power supply voltage and the transistors PT1 and PT2 may correspond to the second path for the first precharge operation in the second precharge circuit 520.

Since the first control signal CLB has the logic high level, the transistor NT3 is turned on, and thus the bitline BL and the sensing node SN are electrically connected to each other.

After the bitline precharge operation and the first precharge operation are performed for a sufficient time interval required for stabilizing the bitline BL and the sensing node SN, during a period P2 after the period P1, a first developing operation for varying a voltage at the sensing node SN is performed.

For example, during the period P2, since the second precharge control signal SU has the logic high level, the transistor PT2 is turned off, the first precharge operation is stopped, and thus the voltage at the sensing node SN is changed due to the current flowing through the nonvolatile memory cell NVMC. When the nonvolatile memory cell NVMC has the first state STATE1, the nonvolatile memory cell NVMC may have a relatively high threshold voltage, the amount of the current flowing through the nonvolatile memory cell NVMC may be relatively small, the number of charges leaked from the sensing capacitor SC to the common source line CSL may be relatively small, and thus the change of the voltage at the sensing node SN may be relatively small. When the nonvolatile memory cell NVMC has the second state STATE2, the nonvolatile memory cell NVMC may have a relatively low threshold voltage, the amount of the current flowing through the nonvolatile memory cell NVMC may be relatively large, the number of charges leaked from the sensing capacitor SC to the common source line CSL may be relatively large, and thus the change of the voltage at the sensing node SN may be relatively large.

Since the change of the voltage at the sensing node SN is relatively large when the nonvolatile memory cell NVMC has the second state STATE2, it may cause greater interferences to neighboring nonvolatile memory cells (or sensing nodes included in neighboring page buffers) when the nonvolatile memory cell NVMC having the second state STATE2 is detected or determined. Such interferences may also cause a sensing error and/or degradation of distributions of memory cells.

In the operation according to an exemplary embodiment of the inventive concept, the first developing operation that is performed during the period P2 may be an operation to figure or find out the lower state cell that causes relatively strong interference and the sensing error. In other words, the first developing operation may not be an operation to precisely or accurately distinguish the lower state cell (or the on cell) having the second state STATE2 from the upper state cell (or the off cell) having the first state STATE1, but may be an operation to roughly sort or filter out the lower state cell.

During a period P3 after the period P2, a first storing operation for storing a result of the first developing operation into the sense amplifying circuit 530 is performed. For example, a result in which the nonvolatile memory cell NVMC is determined as the upper state cell having the first state STATE1 may be stored into the sense amplifying circuit 530.

For example, during the period P3, since the setting signal ST has the logic high level, the transistor NT7 is turned on. In the sense amplifying circuit 530, the lower state cell is sorted or filtered out based on information of the first latch node LAT (e.g., a voltage at the first latch node LAT). When the nonvolatile memory cell NVMC is the upper state cell having the first state STATE1, the information of the first latch node LAT may be changed because the changed voltage at the sensing node SN is higher than a reference voltage VREF. When the nonvolatile memory cell NVMC is the lower state cell having the second state STATE2, the information of the first latch node LAT may be maintained because the changed voltage at the sensing node SN is lower than the reference voltage VREF. Information of the second latch node NLAT (e.g., a voltage at the second latch node NLAT) may be opposite to the information of the first latch node LAT. The reference voltage VREF may be referred to as a trip voltage and may be based on at least one transistor (e.g., NT8) included in the sense amplifying circuit 530.

During a period P4 after the period P3, the second precharge operation for the sensing node SN is selectively performed based on the state of the nonvolatile memory cell NVMC.

For example, during the period P4, since the first precharge control signal LD has the logic high level, the transistor PT1 is turned off. Since the second precharge control signal SU has the logic low level, the transistor PT2 is turned on. The sensing node SN and the sensing capacitor SC are selectively precharged based on the information of the second latch node NLAT (e.g., the voltage at the second latch node NLAT). When the nonvolatile memory cell NVMC has the first state STATE1, the second precharge operation may be further performed. A current path including the second latch node NLAT and the transistors PT2 and PT3 may correspond to the second path for the second precharge operation in the second precharge circuit 520. When the nonvolatile memory cell NVMC has the second state STATE2, the second precharge operation may not be performed.

Since both the transistors PT1 and PT2 are turned on during period P1, the first precharge operation is performed regardless of the information of the second latch node NLAT. Since only the transistor PT2 is turned on during the period P4, the second precharge operation is selectively performed based on the information of the second latch node NLAT. For example, since the state information of the nonvolatile memory cell NVMC is stored into the latch nodes LAT and NLAT during the period P3, the sensing node SN that corresponds to the upper state cell having the first state STATE1 may be precharged during the period P4. The sensing node SN that corresponds to the lower state cell having the second state STATE2 may not be precharged, but may be maintained to a voltage level at an ending point of the period P2.

During a period P5 after the period P4, a second developing operation for varying the voltage at the sensing node SN is selectively performed based on the state of the nonvolatile memory cell NVMC.

For example, during the period P5, since the second precharge control signal SU has the logic high level, the transistor PT2 is turned off. When the nonvolatile memory cell NVMC has the first state STATE1, the second precharge operation is stopped, and thus the voltage at the sensing node SN is changed due to the current flowing through the nonvolatile memory cell NVMC. Since the sensing node SN that corresponds to the upper state cell having the first state STATE1 is precharged during the period P4, the voltage at the sensing node SN that corresponds to the upper state cell having the first state STATE1 is changed during the period P5. When the nonvolatile memory cell NVMC has the second state STATE2, the voltage at the sensing node SN that corresponds to the lower state cell having the second state STATE2 may not be changed, and may be maintained to the voltage level at the ending point of the period P2.

During a period P6 after the period P5, a second storing operation for storing the result of the first developing operation or a result of the second developing operation into the sense amplifying circuit 530 is performed.

For example, during the period P6, since the bitline selection signal BLS have the logic low level, the transistor NT2 is turned off, and thus the bitline precharge operation is stopped. Since the reset signal RST has the logic high level, the transistor NT6 is turned on, and thus the information of the first latch node LAT may be selectively changed.

When the change of the voltage at the sensing node SN is relatively small, and when a final voltage of the sensing node SN is higher than the reference voltage VREF, it may be determined that the nonvolatile memory cell NVMC is the upper state cell having the first state STATE1, and thus the result of the second developing operation may be finally stored into the sense amplifying circuit 530. When the change of the voltage at the sensing node SN is relatively large, and when the final voltage of the sensing node SN is lower than or equal to the reference voltage VREF, it may be determined that the nonvolatile memory cell NVMC is the lower state cell having the second state STATE2, and thus the result of the first developing operation may be finally stored into the sense amplifying circuit 530.

The bitline precharge operation for the bitline BL may be maintained during the periods P1 through P5.

In the page buffer according to an exemplary embodiment of the inventive concept, the unconditional precharge operation may be performed for the bitline BL once regardless of the state of the nonvolatile memory cell NVMC, and the conditional or selective precharge operation may be performed for the sensing node SN once or twice depending on the state of the nonvolatile memory cell NVMC. In addition, the first path for precharging the bitline BL and the second path for precharging the sensing node SN may be electrically separated from each other such that the unconditional and conditional (or selective) precharge operations are substantially simultaneously or concurrently performed. Accordingly, the interferences to neighboring nonvolatile memory cells (or sensing nodes included in neighboring page buffers) may be reduced, the sensing error may be reduced, and the distributions of memory cells may be enhanced.

Figure 4:
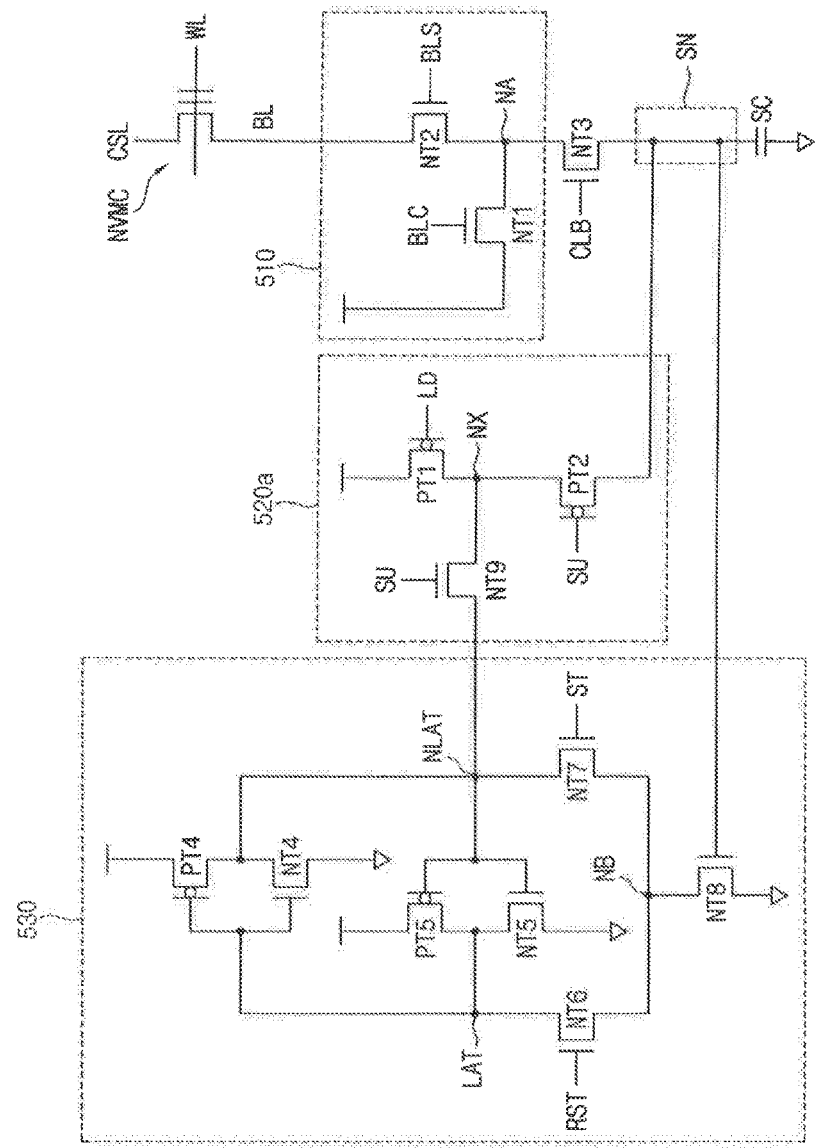
FIGS. 4 and 5 are circuit diagrams illustrating the page buffer of FIG. 1 according to exemplary embodiments of the inventive concept.
Figure 5:
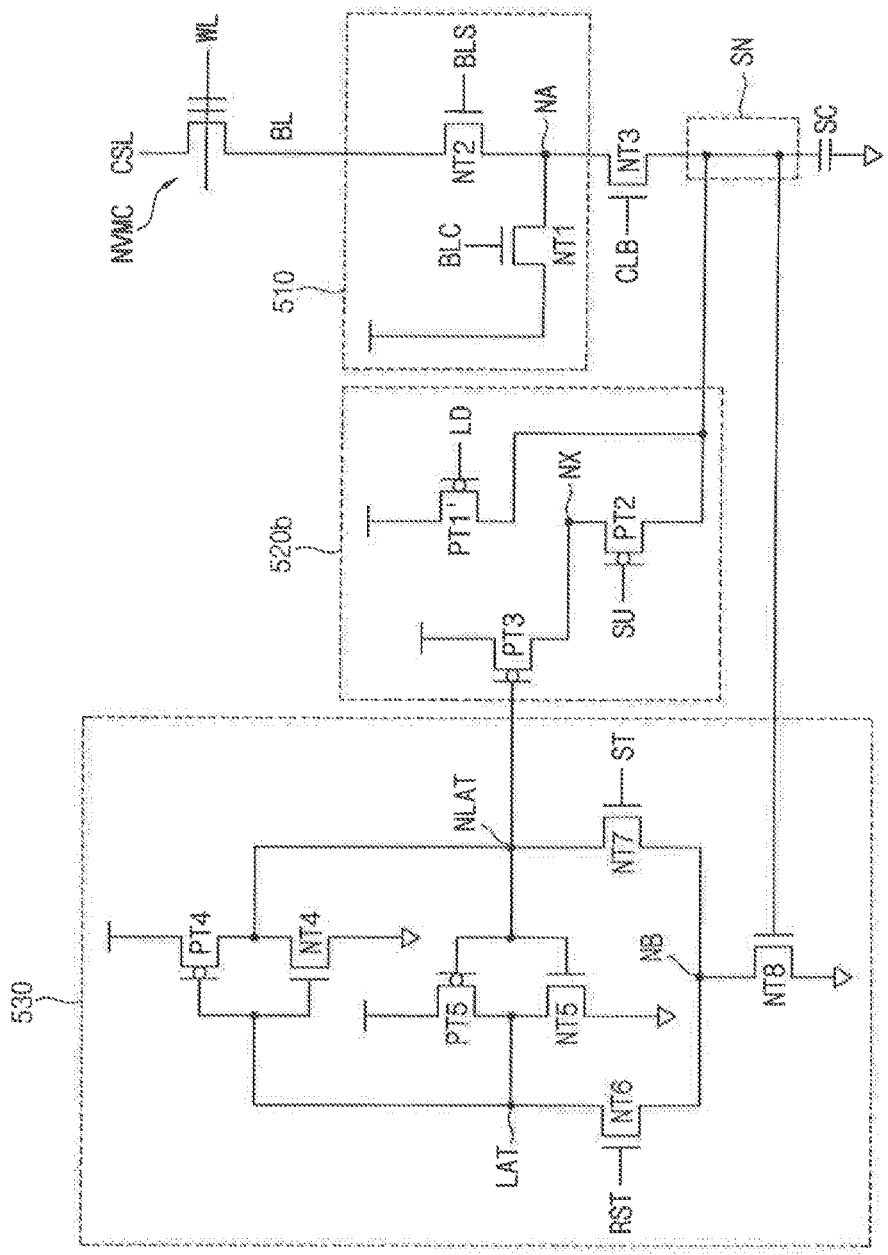

FIGS. 4 and 5 are circuit diagrams illustrating the page buffer of FIG. 1 according to exemplary embodiments of the inventive concept.

Referring to FIG. 4, the page buffer includes the first precharge circuit 510, a second precharge circuit 520a, and the sense amplifying circuit 530. The page buffer may further include the sensing node SN, the sensing capacitor SC, and the transistor NT3.

The page buffer of FIG. 4 may be substantially the same as the page buffer of FIG. 2, except that the transistor PT3 included in the second precharge circuit 520 of FIG. 2 is replaced with a transistor PT9 included in the second precharge circuit 520a of FIG. 4.

The transistor PT9 may be connected between the sense amplifying circuit 530 and the first node NX, and may include a gate electrode receiving the second precharge control signal SU. For example, the transistor PT9 may be connected to the second latch node NLAT of the sense amplifying circuit 530.

An operation of the page buffer of FIG. 4 may be substantially the same as the operation described with reference to FIG. 3.

Referring to FIG. 5, the page buffer includes the first precharge circuit 510, a second precharge circuit 520b, and the sense amplifying circuit 530. The page buffer may further include the sensing node SN, the sensing capacitor SC, and the transistor NT3.

The page buffer of FIG. 5 may be substantially the same as the page buffer of FIG. 2, except that a connection of a transistor PT1' included in the second precharge circuit 520b of FIG. 5 is different from a connection of the transistor PT1 included in the second precharge circuit 520 of FIG. 2.

The transistor PT1' may be connected between the power supply voltage and the sensing node SN, and may include a gate electrode receiving the first precharge control signal LD. The transistor PT1' may not be connected to the first node NX and may be directly connected to the sensing node SN.

Figure 6:
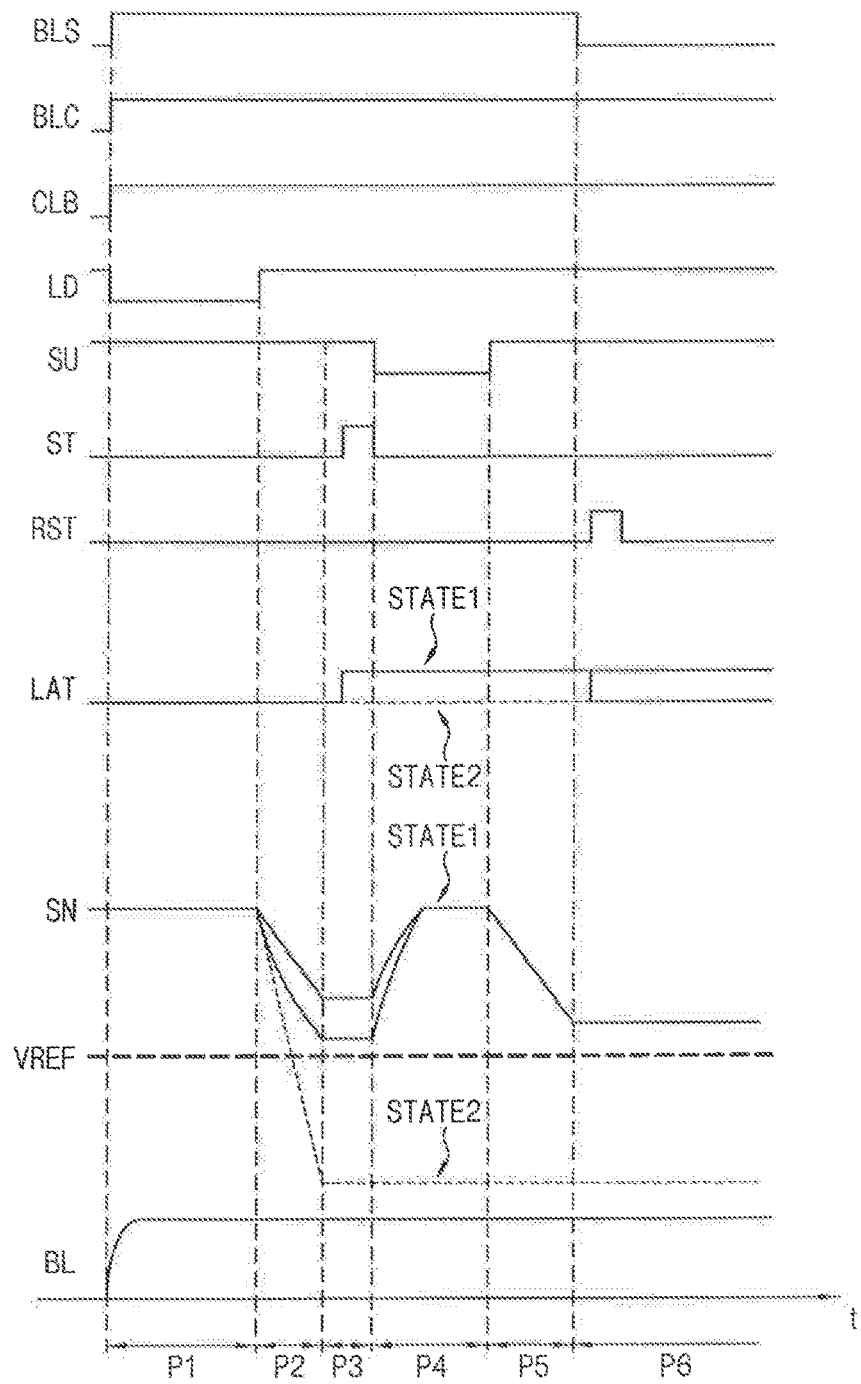
FIG. 6 is a timing diagram for describing an operation of the page buffer of FIG. 5 according to an exemplary embodiment of the inventive concept.

FIG. 6 is a timing diagram for describing an operation of the page buffer of FIG. 5 according to an exemplary embodiment of the inventive concept.

Referring to FIGS. 5 and 6, an operation of the page buffer of FIG. 5 is described in detail based on an example where the nonvolatile memory cell NVMC is a NAND flash memory cell.

An operation illustrated in FIG. 6 may be substantially the same as the operation illustrated in FIG. 3, except that a timing of the second precharge control signal SU in FIG. 6 is different from a timing of the second precharge control signal SU in FIG. 3 during the period P1, and a timing of the first precharge control signal LD in FIG. 6 is different from a timing of the first precharge control signal LD in FIG. 3 during the periods P2 and P3.

During the period P1, the first precharge operation for the sensing node SN and the sensing capacitor SC is performed. For example, since the second precharge control signal SU has the logic high level and the first precharge control signal LD has the logic low level, the transistor PT2 is turned off and the transistor PT1' is turned on, and thus the sensing node SN and the sensing capacitor SC are precharged. A current path including the power supply voltage and the transistor PT1' may correspond to the second path for the first precharge operation in the second precharge circuit 520b.

During the period P2 after the period P1, the first developing operation for varying the voltage at the sensing node SN is performed. For example, since the first precharge control signal LD has the logic high level, the transistor PT1' is turned off, the first precharge operation is stopped, and thus the voltage at the sensing node SN is changed due to the current flowing through the nonvolatile memory cell NVMC.

Figure 7:
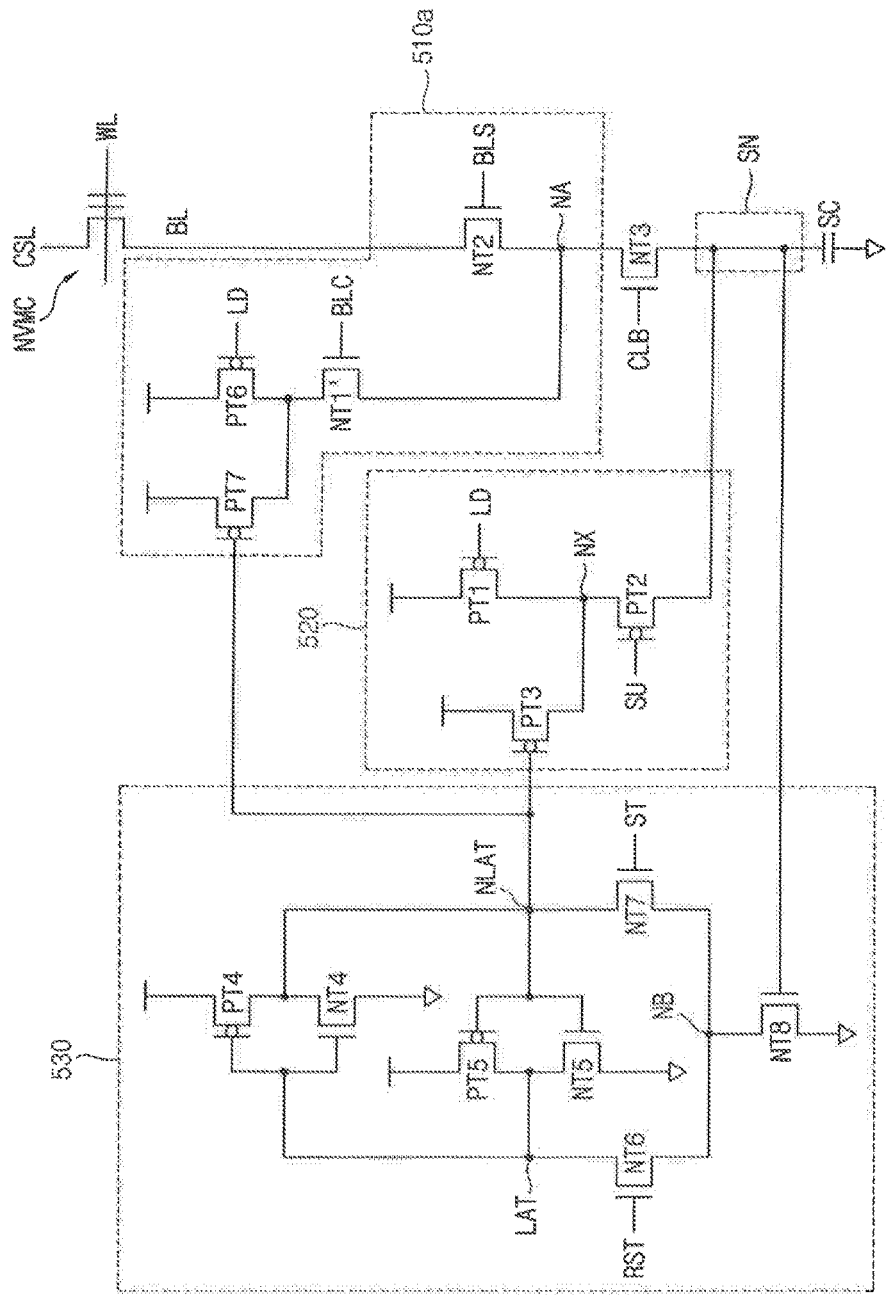
FIG. 7 is a circuit diagram illustrating the page buffer of FIG. 1 according to an exemplary embodiment of the inventive concept.

FIG. 7 is a circuit diagram illustrating the page buffer of FIG. 1 according to an exemplary embodiment of the inventive concept.

Referring to FIG. 7, the page buffer includes a first precharge circuit 510a, the second precharge circuit 520, and the sense amplifying circuit 530. The page buffer may further include the sensing node SN, the sensing capacitor SC, and the transistor NT3.

The page buffer of FIG. 7 may be substantially the same as the page buffer of FIG. 2, except that the first precharge circuit 510a of FIG. 7 further includes transistors PT6 and PT7.

The first precharge circuit 510a may include the plurality of transistors NT1', NT2, PT6, and PT7. A configuration of the first precharge circuit 510a may be similar to that of the second precharge circuit 520.

The transistor NT1' may be connected to the second node NA, and may include a gate electrode receiving the bitline precharge control signal BLC. The transistor NT2 may be connected between the bitline BL and the second node NA, and may include a gate electrode receiving the bitline selection signal BLS. The transistor PT6 may be connected between the power supply voltage and the transistor NT1', and may include a gate electrode receiving the first precharge control signal LD. The transistor PT7 may be connected in parallel with the transistor PT6 between the power supply voltage and the transistor NT1', and including a gate electrode connected to the sense amplifying circuit 530. For example, the gate electrode of the transistor PT7 may be connected to the second latch node NLAT of the sense amplifying circuit 530.

An operation of the page buffer of FIG. 7 may be substantially the same as the operation described with reference to FIG. 3.

Although not illustrated in FIGS. 2, 4, 5, and 7, a page buffer according to exemplary embodiments of the inventive concept may include one of the first precharge circuit 510 of FIG. 2 and the first precharge circuit 510*a* of FIG. 7, and one of the second precharge circuit 520 of FIG. 2, the second precharge circuit 520*a* of FIG. 4, and the second precharge circuit 520*b* of FIG. 5.

Figure 8:
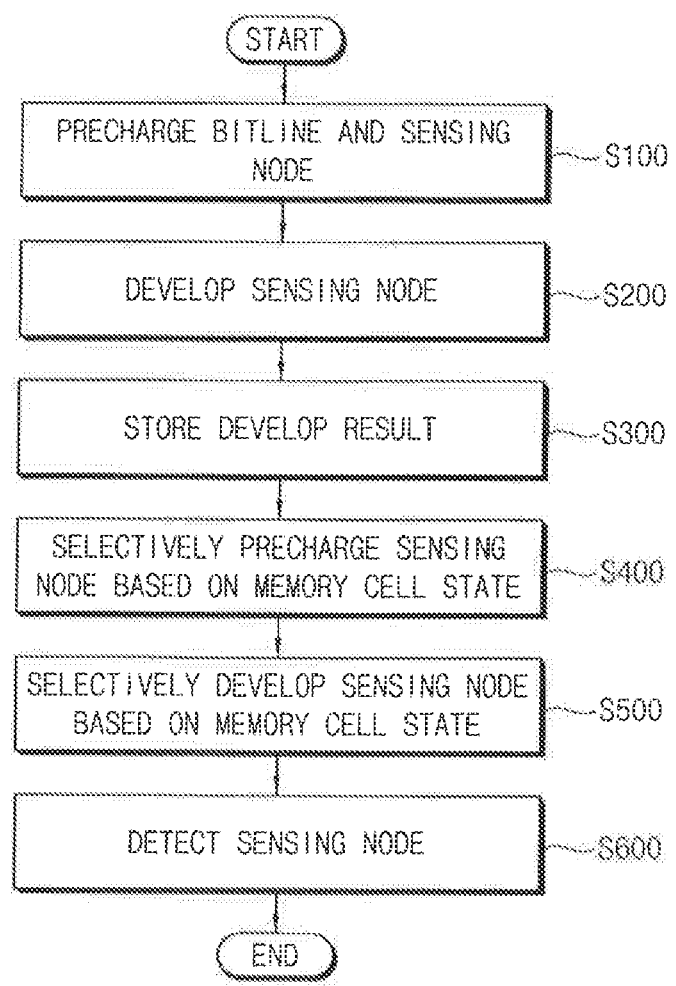
FIG. 8 is a flowchart illustrating a method of sensing a memory cell using a page buffer according to an exemplary embodiment of the inventive concept.

FIG. 8 is a flowchart illustrating a method of sensing a memory cell using a page buffer according to an exemplary embodiment of the inventive concept.

Referring to FIGS. 1 and 8, in a method of sensing a memory cell using the page buffer 500, the bitline precharge operation for the bitline BL is performed, and the first precharge operation for the sensing node SN and the sensing capacitor SC is substantially simultaneously or concurrently performed (operation S100). For example, operation S100 may correspond to the operation during the period P1 of FIG. 3.

After the bitline precharge operation and the first precharge operation are performed for a sufficient time interval required for stabilizing the bitline BL and the sensing node SN, the first developing operation for varying the voltage at the sensing node SN is performed (operation S200). For example, operation S200 may correspond to the operation during the period P2 of FIG. 3.

The first storing operation for storing the result of the first developing operation into the sense amplifying circuit 530 is performed (operation S300). For example, operation S300 may correspond to the operation during the period P3 of FIG. 3.

The second precharge operation for the sensing node SN is selectively performed based on the state of the nonvolatile memory cell NVMC (operation S400). For example, operation S400 may correspond to the operation during the period P4 of FIG. 3. As described above, to perform the conditional or selective precharge operation for the sensing node SN, the first path in the first precharge circuit 510 for precharging the bitline BL and the second path in the second precharge circuit 520 for precharging the sensing node SN may be electrically separated from each other.

The second developing operation for varying the voltage at the sensing node SN is selectively performed based on the state of the nonvolatile memory cell NVMC (operation S500). For example, operation S500 may correspond to the operation during the period P5 of FIG. 3.

The voltage at the sensing node SN is detected to finally sense, detect, or determine the state of the nonvolatile memory cell NVMC (operation S600). For example, the second storing operation for storing the result of the first developing operation or the result of the second developing operation into the sense amplifying circuit 530 may be performed. Operation S600 may correspond to the operation during the period P6 of FIG. 3.

In the method according to an exemplary embodiment of the inventive concept, additional operations (e.g., operations S200, S300, and S400) are performed to separate the developing operation for the lower state cell from the developing operation for the upper state cell, and thus the interferences between neighboring sensing nodes may be reduced. For example, a primary sensing operation may be performed to roughly sort or filter out the lower state cell in which the change of the voltage at the sensing node SN is relatively large, and a secondary sensing operation may be performed for only the upper state cell based on a result of the primary sensing operation (e.g., the state information of the nonvolatile memory device NVMC). In other words, a sensing operation of filtering the lower state cell may be performed before a main sensing operation.

As described above, to perform the method according to an exemplary embodiment of the inventive concept, the first path for precharging the bitline BL and the second path for precharging the sensing node SN may be electrically separated from each other.

Figure 9:
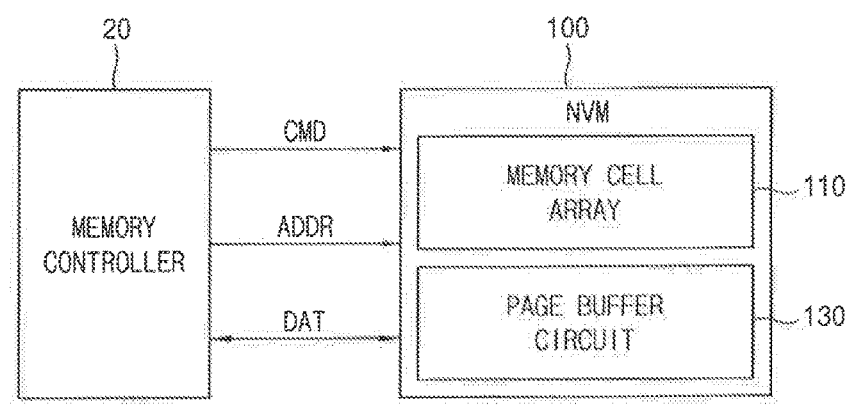
FIG. 9 is a block diagram illustrating a memory system including a nonvolatile memory device according to an exemplary embodiment of the inventive concept.

FIG. 9 is a block diagram illustrating a memory system including a nonvolatile memory device according to an exemplary embodiment of the inventive concept.

Referring to FIG. 9, a memory system 10 includes a memory controller 20 and a nonvolatile memory device (NVM) 100.

The nonvolatile memory device 100 is controlled and/or accessed by the memory controller 20. For example, based on requests from an external device (e.g., a host), the memory controller 20 may store (e.g., write or program) data into the nonvolatile memory device 100, may retrieve (e.g., read or sense) data from the nonvolatile memory device 100, or may erase data stored in the nonvolatile memory device 100.

The memory controller 20 transmits a command CMD and an address ADDR to the nonvolatile memory device 100 via control signal lines, and exchanges data DAT with the nonvolatile memory device 100 via data input/output (I/O) lines. At least a part or all of the control signal lines and the data I/O lines may be referred to as a channel.

The memory controller 20 may further transmit a control signal to the nonvolatile memory device 100 via the control signal lines, or may further transmit a power supply voltage to the nonvolatile memory device 100 via power lines. For example, the control signal may include a data strobe signal (DQS), a chip enable signal (/CE), a write enable signal (/WE), a read enable signal (/RE), a command latch enable signal (CLE), an address latch enable signal (ALE), etc.

The nonvolatile memory device 100 includes a memory cell array 110 and a page buffer circuit 130.

The memory cell array 110 includes a plurality of nonvolatile memory cells that are connected to a plurality of bitlines and a plurality of wordlines.

The page buffer circuit 130 includes a plurality of page buffers that are connected to the plurality of bitlines. Each page buffer may be the page buffer according to exemplary embodiments of the inventive concept, as described above with reference to FIGS. 1 through 8. In the page buffer according to exemplary embodiments of the inventive concept, the unconditional precharge operation may be performed for the bitline BL once regardless of the state of the nonvolatile memory cell NVMC, and the conditional or selective precharge operation may be performed for the sensing node SN once or twice depending on the state of the nonvolatile memory cell NVMC. In addition, the first path for precharging the bitline BL and the second path for precharging the sensing node SN may be electrically separated from each other such that the unconditional and conditional (or selective) precharge operations are substantially simultaneously or concurrently performed. Accordingly, the interferences to neighboring nonvolatile memory cells (or sensing nodes included in neighboring page buffers) may be reduced, the sensing error may be reduced, and the distributions of memory cells may be enhanced.

Figure 10:
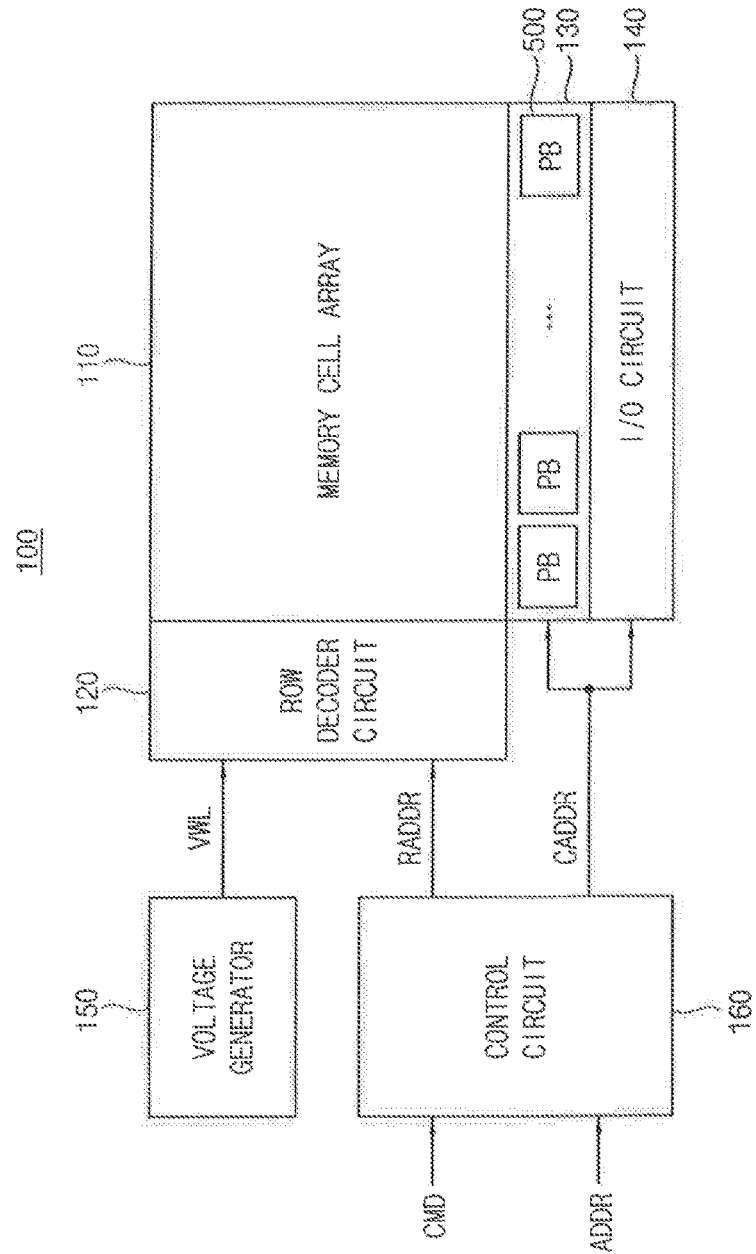
FIG. 10 is a block diagram illustrating the nonvolatile memory device of FIG. 9 according to an exemplary embodiment of the inventive concept.

FIG. 10 is a block diagram illustrating the nonvolatile memory device of FIG. 9 according to an exemplary embodiment of the inventive concept.

Referring to FIG. 10, the nonvolatile memory device 100 may include the memory cell array 110, a row decoder circuit 120, the page buffer circuit 130, an I/O circuit 140, a voltage generator 150, and a control circuit 160.

The memory cell array 110 may include a plurality of nonvolatile memory cells. Each of the plurality of nonvolatile memory cells may be connected to a respective one of the plurality of wordlines and a respective one of the plurality of bitlines. For example, the plurality of nonvolatile memory cells may be NAND flash memory cells. As will be described with reference to FIGS. 11A and 11B, the plurality of nonvolatile memory cells may be arranged in a two dimensional (2D) array structure or a three dimensional (3D) vertical array structure.

The row decoder circuit 120 may be connected to the plurality of wordlines. The row decoder circuit 120 may determine at least one of the plurality of wordlines as a selected wordline and may determine the rest of the plurality of wordlines as unselected wordlines, based on a row address RADDR.

The voltage generator 150 may generate wordline voltages VWL, which are required for an operation of the nonvolatile memory device 100, based on a power supply voltage. The wordline voltages VWL may be applied to the plurality of wordlines via the row decoder circuit 120.

For example, during a data erase operation, the voltage generator 150 may apply an erase voltage to a well of a memory block and may apply a ground voltage to entire wordlines of the memory block. During an erase verification operation, the voltage generator 150 may apply an erase verification voltage to all of the wordlines of the memory block or sequentially apply the erase verification voltage on a wordline-by-wordline basis. During a data program operation, the voltage generator 150 may apply a program voltage to the selected wordline and may apply a program pass voltage to the unselected wordlines. During a program verification operation, the voltage generator 150 may apply a program verification voltage to the selected wordline and may apply a verification pass voltage to the unselected wordlines. During a data read operation, the voltage generator 150 may apply a read voltage to the selected wordline and may apply a read pass voltage to the unselected wordlines.

The page buffer circuit 130 may be connected to the plurality of bitlines. The page buffer circuit 130 may store write data to be programmed into the memory cell array 110 or may read data sensed from the memory cell array 110, based on a column address CADDR. In other words, the page buffer circuit 130 may operate as a write driver or a sensing amplifier depending on an operation mode of the nonvolatile memory device 100.

The page buffer circuit 130 may include a plurality of page buffers 500, each of which is connected to a respective one of the plurality of bitlines. Each of the plurality of page buffers 500 may correspond to the page buffer according to exemplary embodiments of the inventive concept, as described above with reference to FIGS. 1 through 8.

The I/O circuit 140 may provide the write data to the memory cell array 110 via the page buffer circuit 130 or may provide the read data to the outside of the nonvolatile memory device 100 (e.g., to the memory controller 20 in FIG. 9), based on the column address CADDR.

In an exemplary embodiment of the inventive concept, the page buffer circuit 130 and the I/O circuit 140 may read data from a first area of the memory cell array 110 and may write the read data to a second area of the memory cell array 110. In other words, the page buffer circuit 130 and the I/O circuit 140 may perform a copy-back operation.

The control circuit 160 may control the row decoder circuit 120, the page buffer circuit 130, the I/O circuit 140, and the voltage generator 150 based on the command CMD and the address ADDR to perform the data program/read/erase operations for the memory cell array 110. For example, the control circuit 160 may generate control signals for the row decoder circuit 120, the page buffer circuit 130, the I/O circuit 140, and the voltage generator 150 based on the command CMD, and may generate the row address RADDR and the column address CADDR based on the address ADDR.

In an exemplary embodiment of the inventive concept, the plurality of nonvolatile memory cells included in the memory cell array 110 may be divided into a first group of nonvolatile memory cells having a first state (e.g., the first state STATE1 in FIG. 3) and a second group of nonvolatile memory cells having a second state (e.g., the second state STATE2 in FIG. 3). The page buffer circuit 130 may perform the precharge and developing operations for the first group of nonvolatile memory cells twice, and may perform the precharge and developing operations for the second group of nonvolatile memory cells once. For example, the first precharge operation and the first developing operation may be performed for all of the nonvolatile memory cells included in the memory cell array 110, and the second precharge operation and the second developing operation may be further performed for the first group of nonvolatile memory cells after the first precharge operation and the first developing operation. During the second precharge operation and the second developing operation, the second group of nonvolatile memory cells may maintain a previous status without an additional sensing operation.

Figure 11A:
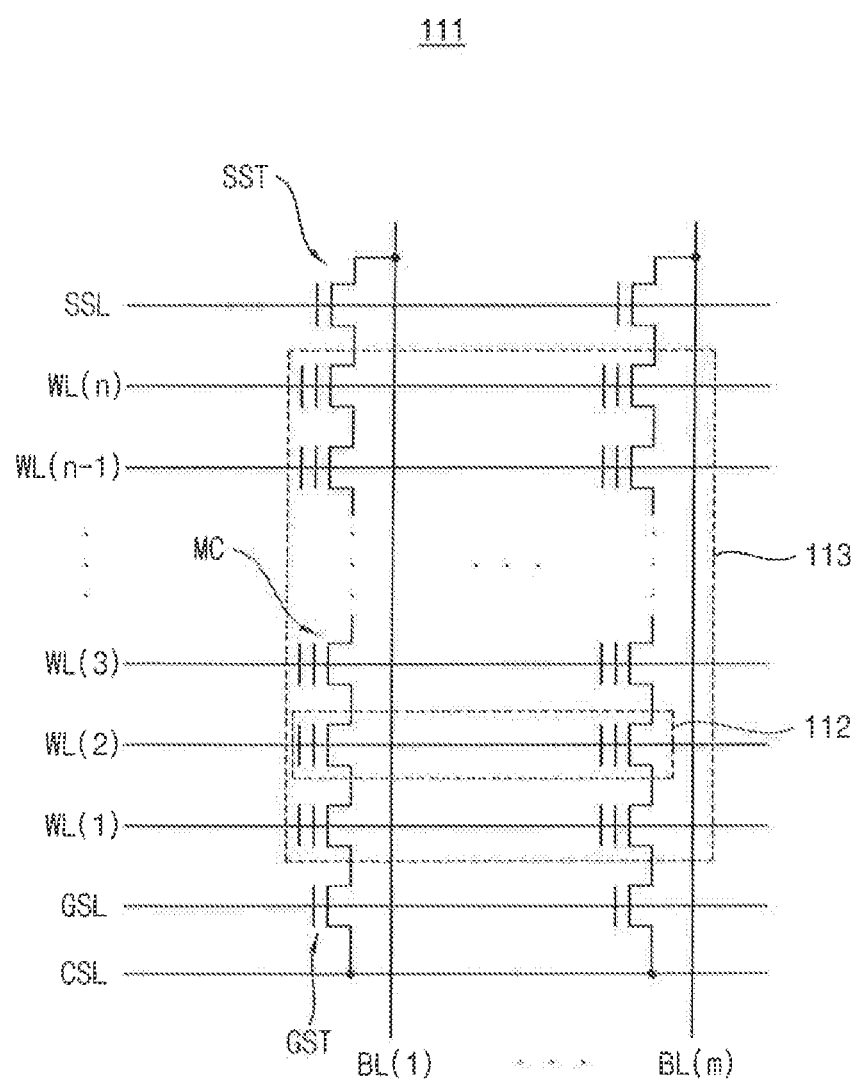
FIGS. 11A and 11B are diagrams illustrating a memory cell array included in a nonvolatile memory device according to exemplary embodiments of the inventive concept.
Figure 11B:
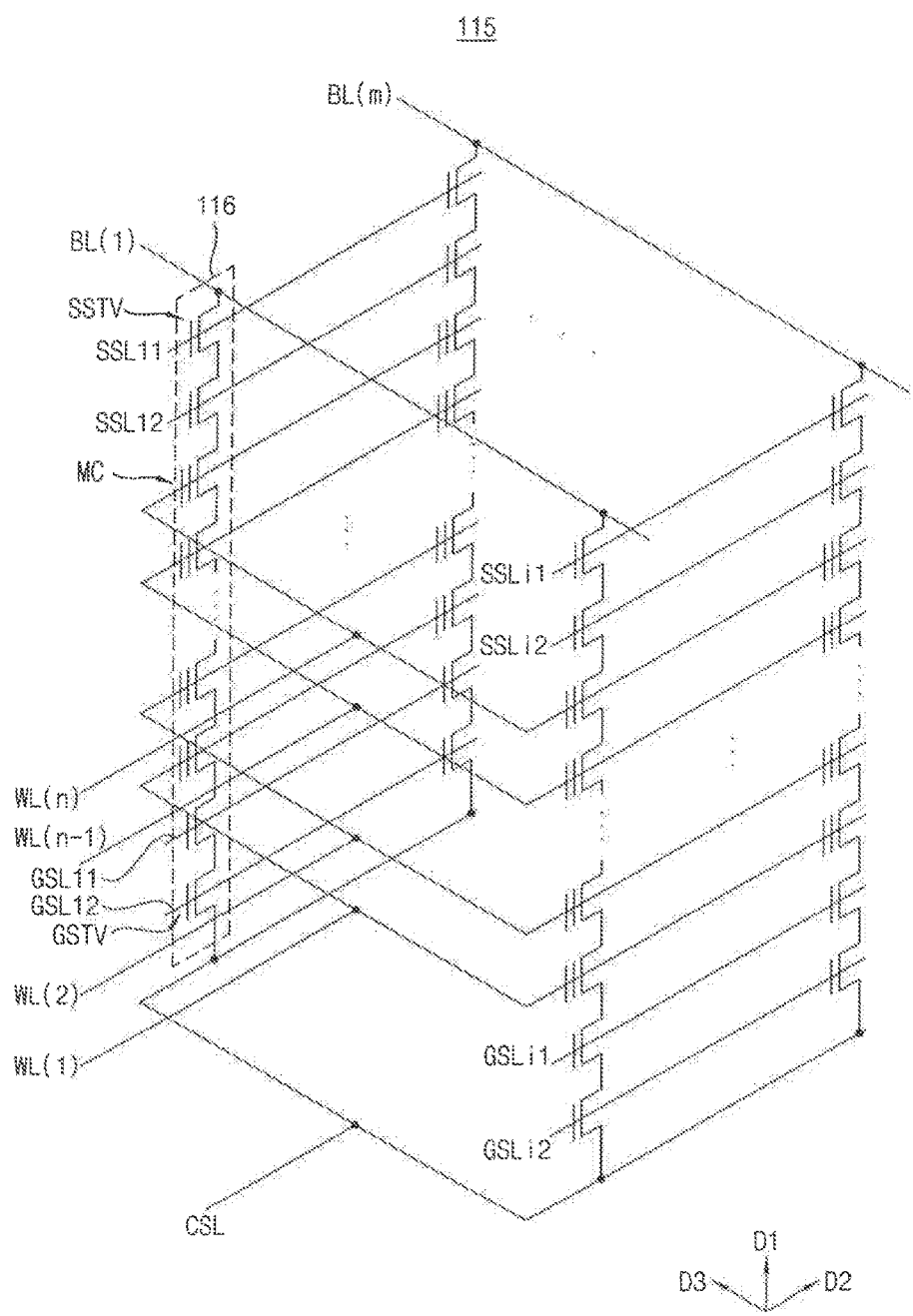

FIGS. 11A and 11B are diagrams illustrating a memory cell array included in a nonvolatile memory device according to exemplary embodiments of the inventive concept. FIG. 11A is a circuit diagram illustrating an example of a memory cell array included in a NAND flash memory device. FIG. 11B is a circuit diagram illustrating an example of a memory cell array included in a vertical NAND flash memory device.

Referring to FIG. 11A, a memory cell array 111 may include string selection transistors SST, ground selection transistors GST, and memory cells MC. The string selection transistors SST may be connected to bitlines BL(1), . . . , BL(m), and the ground selection transistors GST may be connected to a common source line CSL. The memory cells arranged in the same row may be disposed in series between one of the bitlines BL(1)~BL(m) and the common source line CSL, and the memory cells arranged in the same column may be connected in common to one of wordlines WL(1), WL(2), WL(3), . . . , WL(n−1), WL(n). In other words, the memory cells MC may be connected in series between the string selection transistors SST and the ground selection transistors GST, and 16, 32, or 64 wordlines may be disposed between a string selection line SSL connected to the string selection transistors SST and a ground selection line GSL connected to the ground selection transistors GST.

The string selection transistors SST may be connected to the string selection line SSL such that the string selection transistors SST are controlled according to a level of a voltage applied from the string selection line SSL. The ground selection transistors GST may be connected to the ground selection line GSL such that the ground selection transistors GST are controlled according to a level of a voltage applied from the ground selection line GSL. The memory cells MC may be controlled according to levels of voltages applied to the wordlines WL(1)~WL(n).

The NAND flash memory device including the memory cell array 111 may perform the data read and write operations in units of page 112 and the data erase operation in units of block 113. In an exemplary embodiment of the inventive concept, each of page buffers, e.g., in the page buffer circuit 130 of FIG. 9, may be connected to even and odd bitlines one by one. In this case, the even bitlines form an even page, the odd bitlines form an odd page, and the data write operation for the memory cells MC of the even and odd pages may be performed in turns and sequentially.

Referring to FIG. 11B, a memory cell array 115 may include a plurality of strings 116 having a vertical structure. The plurality of strings 116 may be formed in a second direction D2 such that a string row may be formed. A plurality of string rows may be formed in a third direction D3 such that a string array may be formed. Each of the strings 116 may include ground selection transistors GSTV, memory cells MC, and string selection transistors SSTV which are disposed in series in a first direction D1 between bitlines BL(1), . . . , BL(m) and a common source line CSL.

The ground selection transistors GSTV may be connected to ground selection lines GSL11, GSL12, . . . , GSLi1, GSLi2, and the string selection transistors SSTV may be connected to string selection lines SSL11, SSL12, . . . , SSLi1, SSLi2. The memory cells MC arranged on the same layer may be connected in common to one of wordlines WL(1), WL(2), . . . , WL(n−1), WL(n). The ground selection lines GSL11~GSLi2 and the string selection lines SSL11~SSLi2 may extend in the second direction D2 and may be formed along the third direction D3. The wordlines WL(1)~WL(n) may extend in the second direction D2 and may be formed along the first and third directions D1 and D3. The bitlines BL(1)~BL(m) may extend in the third direction D3 and may be formed along the second direction D2. The memory cells MC may be controlled according to levels of voltages applied to the wordlines WL(1)~WL(n).

In an exemplary embodiment of the inventive concept, two string selection transistors included in one string 116 may be connected to one string selection line, and two ground selection transistors included in one string may be connected to one ground selection line. In an exemplary embodiment of the inventive concept, one string 116 may include one string selection transistor and one ground selection transistor.

A three dimensional (3D) vertical array structure may include vertical NAND strings that are vertically oriented such that at least one memory cell is located over another memory cell. The at least one memory cell may include a charge trap layer. The following patent documents, which are hereby incorporated by reference in their entireties, describe suitable configurations for a memory cell array including a 3D vertical array structure, in which the 3D memory array is configured as a plurality of levels, with wordlines and/or bitlines shared between levels: U.S. Pat. Nos. 7,679,133, 8,553,466, 8,654,587, and 8,559,235, and US Pat. Pub. No. 2011/0233648.

As the integration of 3D vertical array structure increases, the number of levels may increase, a distance between a wiring layer and an active layer (e.g., a layer including a gate electrode and an impurity region) may increase, and thus a connection between the wiring layer and the active layer may also be longer. The interference effect may increase due to the longer connection, and thus sensing error may be caused due to the interference effect. On the other hand, for the page buffer according to exemplary embodiments of the inventive concept, the interferences between neighboring sensing nodes may be reduced, the sensing error may be reduced, and the distributions of memory cells may be enhanced.

Although the memory cell array included in the nonvolatile memory device according to exemplary embodiments of the inventive concept is described based on a flash memory device, the nonvolatile memory device may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 12:
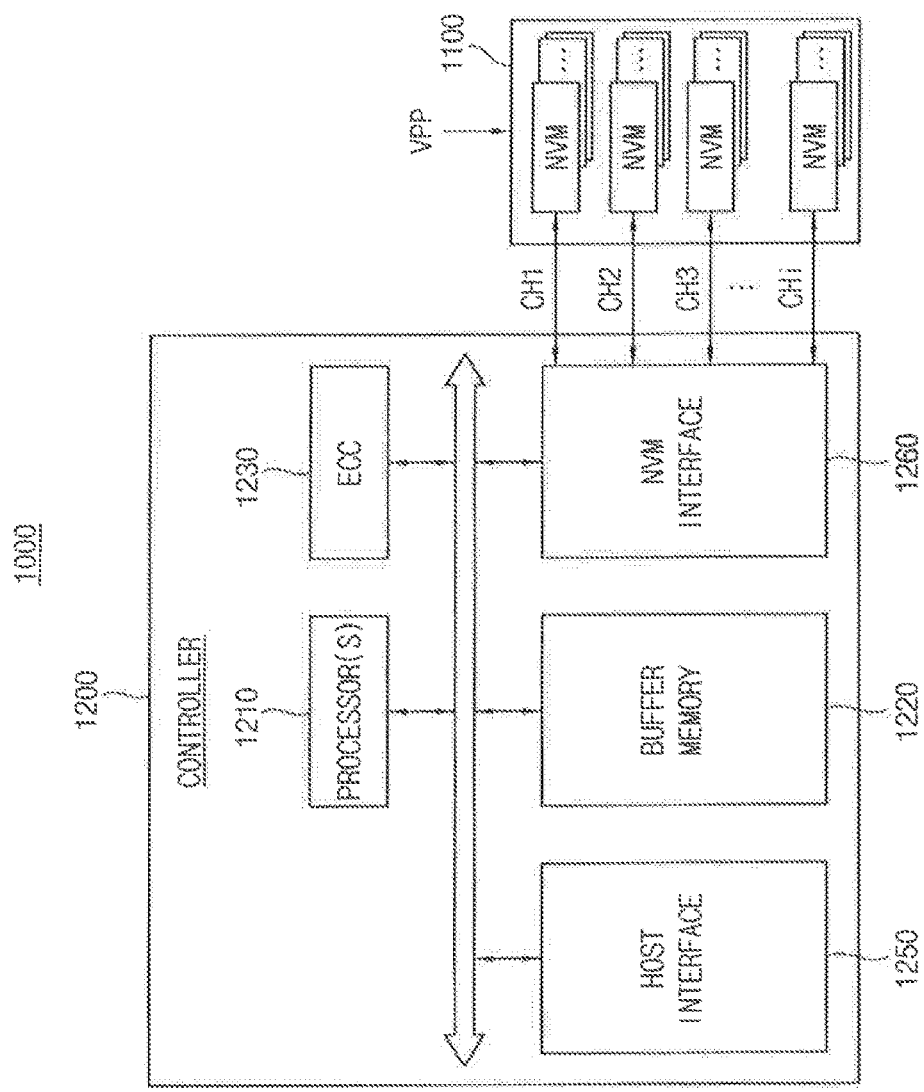
FIG. 12 is a block diagram illustrating a solid state disc or solid state drive (SSD) according to an exemplary embodiment of the inventive concept.

FIG. 12 is a block diagram illustrating a solid state disc or solid state drive (SSD) according to an exemplary embodiment of the inventive concept.

Referring to FIG. 12, a SSD 1000 includes multiple nonvolatile memory devices 1100 and an SSD controller 1200.

The SSD controller 1200 may be connected to the nonvolatile memory devices 1100 through multiple channels CH1, CH2, CH3, , , , . CHi. The SSD controller 1200 may include one or more processors 1210, a buffer memory 1220, an error correction code (ECC) circuit 1230, a host interface 1250, and a nonvolatile memory interface 1260.

The buffer memory 1220 may store data used to drive the SSD controller 1200. The buffer memory 1220 may include multiple memory lines each storing data or a command. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. For example, the nonvolatile memory interface 1260 may provide an interface with the nonvolatile memory devices 1100.

Each of the nonvolatile memory devices 1100 may correspond to the nonvolatile memory device according to exemplary embodiments of the inventive concept and may be optionally supplied with an external high voltage VPP.

The inventive concept may be applied to various devices and systems that include an nonvolatile memory device. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

As described above, in the page buffer and the nonvolatile memory device according to exemplary embodiments of the inventive concept, the unconditional precharge operation may be performed for the bitline once regardless of the state of the nonvolatile memory cell therein, and the conditional or selective precharge operation may be performed for the sensing node once or twice depending on the state of the nonvolatile memory cell. In addition, the first path for precharging the bitline and the second path for precharging the sensing node may be electrically separated from each other such that the unconditional and the conditional (or selective) precharge operations are substantially simultaneously or concurrently performed. Accordingly, the interferences between neighboring nonvolatile memory cells (or neighboring sensing nodes) may be reduced, the sensing error may be reduced, and the distributions of memory cells may be enhanced.

While the inventive concept has been shown and described with reference to exemplary embodiments thereof, it will be understood by those of ordinary skill in the art that various changes in form and details may be made thereto without departing from the spirit and scope of the inventive concept, as set forth in the following claims.

What is claimed is:

1. A page buffer comprising:
a first precharge circuit including a first path for precharging a bitline connected to a nonvolatile memory cell;
a second precharge circuit including a second path for precharging a sensing node connected to the bitline, wherein the second path is electrically separated from the first path and the sensing node is used to detect a state of the nonvolatile memory cell;
a sense amplifying circuit connected to the sensing node and the second precharge circuit, and configured to store state information representing the state of the nonvolatile memory cell,
wherein the second precharge circuit is configured to perform a first precharge operation for the sensing node and configured to selectively perform a second precharge operation for the sensing node based on the state of the nonvolatile memory cell after the first precharge operation.

2. The page buffer of claim 1, wherein the second precharge operation is performed when the nonvolatile memory cell has a first state in which a current less than a reference current flows through the nonvolatile memory cell, and
the second precharge operation is not performed when the nonvolatile memory cell has a second state in which a current greater than or equal to the reference current flows through the nonvolatile memory cell.

3. The page buffer of claim 2, wherein a first developing operation for varying a voltage at the sensing node and a first storing operation for storing a result of the first developing operation into the sense amplifying circuit are performed after a bitline precharge operation for the bitline and the first precharge operation for the sensing node are performed.

4. The page buffer of claim 3, wherein when the nonvolatile memory cell has the first state, a second developing operation for varying the voltage at the sensing node and a second storing operation for storing a result of the second developing operation into the sense amplifying circuit are performed after the second precharge operation for the sensing node is performed.

5. The page buffer of claim 2, wherein the nonvolatile memory cell includes a charge storage layer,
the nonvolatile memory cell has the first state when a number of charges stored in the charge storage layer is greater than a reference number, and
the nonvolatile memory cell has the second state when the number of charges stored in the charge storage layer is less than or equal to the reference number.

6. The page buffer of claim 1, wherein the second precharge circuit includes:
a first transistor connected between a power supply voltage and a first node, and including a gate electrode configured to receive a first precharge control signal;
a second transistor connected between the first node and the sensing node, and including a gate electrode configured to receive a second precharge control signal; and
a third transistor connected between the power supply voltage and the first node, and including a gate electrode connected to the sense amplifying circuit.

7. The page buffer of claim 6, wherein the first precharge circuit includes:
a fourth transistor connected between the power supply voltage and a second node, and including a gate electrode configured to receive a bitline precharge control signal; and
a fifth transistor connected between the bitline and the second node, and including a gate electrode configured to receive a bitline selection signal.

8. The page buffer of claim 7, further comprising:
a sixth transistor connected between the second node and the sensing node, and including a gate electrode configured to receive a first control signal.

9. The page buffer of claim 7, wherein the first precharge circuit further includes:
a sixth transistor connected between the power supply voltage and the fourth transistor, and including a gate electrode configured to receive the first precharge control signal; and
a seventh transistor connected between the power supply voltage and the fourth transistor, and including a gate electrode connected to the sense amplifying circuit.

10. The page buffer of claim 9, wherein the gate electrode of the third transistor and the gate electrode of the seventh transistor are connected to each other.

11. The page buffer of claim 6, wherein the sense amplifying circuit includes:
a first inverter including an input terminal connected to a first latch node and an output terminal connected to a second latch node;
a second inverter including an input terminal connected to the second latch node and an output terminal connected to the first latch node;
a fourth transistor connected between the first latch node and a second node, and including a gate electrode configured to receive a reset signal;
a fifth transistor connected between the second latch node and the second node, and including a gate electrode configured to receive a setting signal; and
a sixth transistor connected between the second node and a ground voltage, and including a gate electrode connected to the sensing node.

12. The page buffer of claim 11, wherein the gate electrode of the third transistor is connected to the second latch node.

13. The page buffer of claim 11, wherein the first inverter includes:
a seventh transistor connected between the power supply voltage and the second latch node, and including a gate electrode connected to the first latch node; and
an eighth transistor connected between the second latch node and the ground voltage, and including a gate electrode connected to the first latch node.

14. The page buffer of claim 1, wherein the second precharge circuit includes:
a first transistor connected between a power supply voltage and a first node, and including a gate electrode configured to receive a first precharge control signal;
a second transistor connected between the first node and the sensing node, and including a gate electrode configured to receive a second precharge control signal; and
a third transistor connected between the sense amplifying circuit and the first node, and including a gate electrode configured to receive the second precharge control signal.

15. The page buffer of claim 1, wherein the second precharge circuit includes:
- a first transistor connected between a power supply voltage and the sensing node, and including a gate electrode configured to receive a first precharge control signal;
- a second transistor connected between a first node and the sensing node, and including a gate electrode configured to receive a second precharge control signal; and
- a third transistor connected between the power supply voltage and the first node, and including a gate electrode connected to the sense amplifying circuit.

16. The page buffer of claim 1, wherein the nonvolatile memory cell includes a NAND flash memory cell.

17. A nonvolatile memory device comprising:
- a memory cell array including a plurality of nonvolatile memory cells connected to a plurality of bitlines and a plurality of wordlines; and
- a page buffer circuit including a plurality of page buffers connected to the plurality of bitlines,
- wherein a first page buffer among the plurality of page buffers includes:
- a first precharge circuit including a first path for precharging a first bitline among the plurality of bitlines connected to a first nonvolatile memory cell among the plurality of nonvolatile memory cells;
- a second precharge circuit including a second path for precharging a sensing node connected to the first bitline, wherein the second path is electrically separated from the first path and the sensing node is used to detect a state of the first nonvolatile memory cell; and
- a sense amplifying circuit connected to the sensing node and the second precharge circuit, and configured to store state information representing the state of the first nonvolatile memory cell,
- wherein the second precharge circuit is configured to perform a first precharge operation for the sensing node and configured to selectively perform a second precharge operation for the sensing node based on the state of the first nonvolatile memory cell after the first precharge operation.

18. The nonvolatile memory device of claim 17, further comprising:
- a row decoder circuit connected to the plurality of wordlines;
- an input/output (I/O) circuit connected to the page buffer circuit; and
- a control circuit configured to control operations of the row decoder circuit, the page buffer circuit, and the I/O circuit.

19. The nonvolatile memory device of claim 17, wherein the memory cell array includes a three-dimensional (3D) memory array in which the plurality of wordlines or the plurality of bitlines are shared between levels.

20. A method of sensing a nonvolatile memory cell using a page buffer that is connected to the nonvolatile memory cell through a bitline and includes a first path, a second path, and a sensing node, the first path and the second path being electrically separated from each other, and the sensing node being connected to the bitline and used to detect a state of the nonvolatile memory cell, the method comprising:
- performing, by the first path, a bitline precharge operation for the bitline;
- performing, by the second path, a first precharge operation for the sensing node;
- performing a first developing operation for varying a voltage at the sensing node;
- performing a first storing operation for storing a result of the first developing operation;
- selectively performing, by the second path, a second precharge operation for the sensing node based on the state of the nonvolatile memory cell;
- selectively performing a second developing operation for varying the voltage at the sensing node based on the state of the nonvolatile memory cell; and
- detecting the voltage at the sensing node.

* * * * *